(12) United States Patent
Metzger et al.

(10) Patent No.: US 7,261,825 B2
(45) Date of Patent: Aug. 28, 2007

(54) METHOD FOR THE PRODUCTION OF A MICROMECHANICAL DEVICE, PARTICULARLY A MICROMECHANICAL OSCILLATING MIRROR DEVICE

(75) Inventors: Lars Metzger, Müssinger (DE); Frank Fischer, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 92 days.

(21) Appl. No.: 10/522,694

(22) PCT Filed: Feb. 21, 2003

(86) PCT No.: PCT/DE03/00550

§ 371 (c)(1),
(2), (4) Date: Sep. 8, 2005

(87) PCT Pub. No.: WO2004/016547

PCT Pub. Date: Feb. 26, 2004

(65) Prior Publication Data

US 2006/0096944 A1   May 11, 2006

(30) Foreign Application Priority Data

Aug. 2, 2002 (DE) ................. 102 35 371

(51) Int. Cl.
*H01L 21/302* (2006.01)
*C23F 1/00* (2006.01)

(52) U.S. Cl. ............... 216/2; 216/58; 216/67; 438/706; 438/710; 438/733; 438/737

(58) Field of Classification Search .............. 216/2, 216/58, 67; 438/705, 733, 737
See application file for complete search history.

(56) References Cited

U.S. PATENT DOCUMENTS

| | | | |
|---|---|---|---|
| 5,198,390 A | | 3/1993 | MacDonald et al. |
| 5,876,879 A | * | 3/1999 | Kleinhenz et al. .............. 430/5 |
| 6,388,300 B1 | | 5/2002 | Kano et al. |
| 6,653,221 B1 | * | 11/2003 | Subramanian et al. ....... 438/620 |
| 6,759,340 B2 | * | 7/2004 | Nallan et al. ................ 438/714 |
| 7,052,623 B1 | * | 5/2006 | Becker et al. ................. 216/67 |
| 7,083,997 B2 | * | 8/2006 | Brosnihhan et al. .......... 438/50 |
| 2002/0066924 A1 | * | 6/2002 | Blanchard .................... 257/328 |

FOREIGN PATENT DOCUMENTS

| | | |
|---|---|---|
| DE | 40 00 496 | 2/1991 |
| DE | 42 41 045 | 5/1994 |
| DE | 197 57 197 | 6/1999 |
| DE | 198 47 455 | 4/2000 |
| WO | WO96 08036 | 3/1996 |
| WO | WO97 15066 | 4/1997 |
| WO | WO 02 12116 | 2/2002 |

* cited by examiner

*Primary Examiner*—Shamim Ahmed
(74) *Attorney, Agent, or Firm*—Kenyon & Kenyon LLP

(57) ABSTRACT

A method for producing a micromechanical device, e.g., a micromechanical oscillating mirror device, is provided. It is provided, starting from the front side of an SOI/EOI(epipoly on insulator) substrate, to penetrate to the desired depth of the silicon substrate layer in two successive, separate deep etching steps, and to use this in its upper region that is close to the oxide layer as sacrificial layer for vertically exposing the island structures that are positioned above the oxide layer in the functional layer. The method according to the present invention of a sacrificial layer process for generating large vertical deflections utilizes purely surface micromechanical process steps.

16 Claims, 4 Drawing Sheets

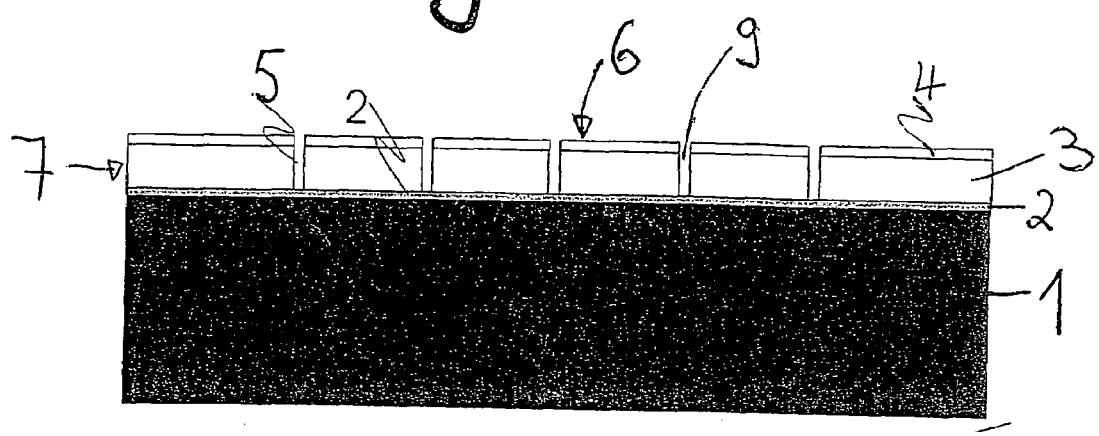
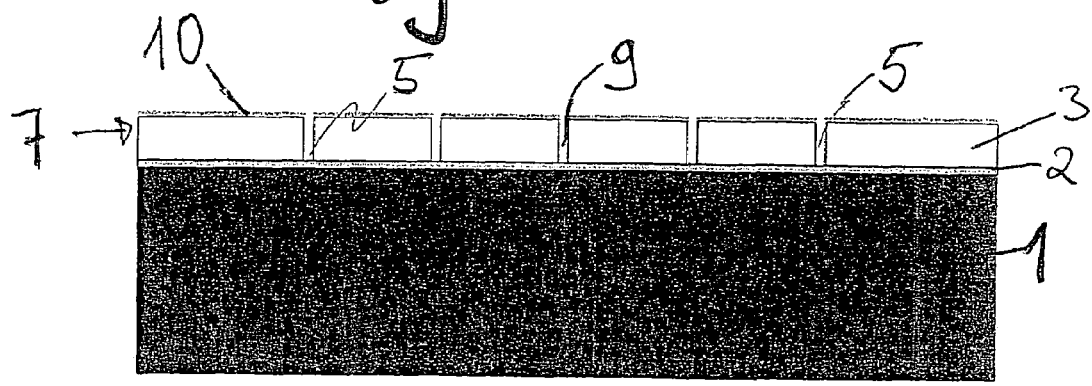

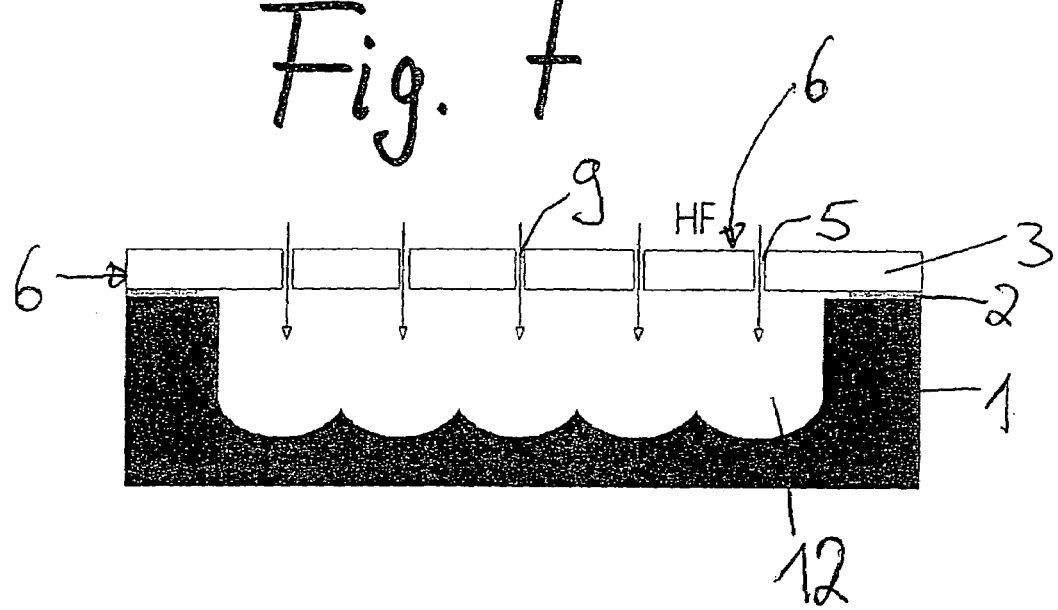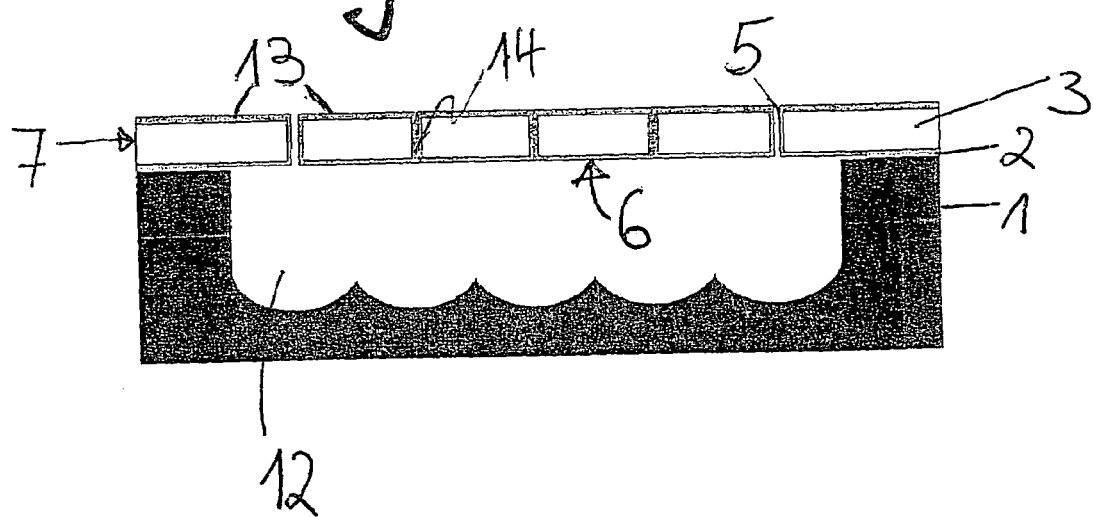

METHOD FOR THE PRODUCTION OF A MICROMECHANICAL DEVICE, PARTICULARLY A MICROMECHANICAL OSCILLATING MIRROR DEVICE

FIELD OF THE INVENTION

The present invention relates to a method for producing a micromechanical device, e.g., a micromechanical oscillating mirror device, by exposing a vertically deflectable, e.g., tiltable, island region made of silicon, using an etching process in a silicon substrate layer lying below the island region.

BACKGROUND INFORMATION

A method of the above-described type is disclosed in published German Patent Document DE 197 57 197 and U.S. Pat. No. 5,198,390, which will be mentioned in greater detail below.

Although applicable to any number of micromechanical devices and structures, particularly switches and light modulators for displays, the basic underlying problem definition relating to the present invention is explained with reference to a micromechanical oscillating mirror device which can be manufactured using the technology of silicon surface micromechanics.

Micromechanical oscillating mirror devices are used, for example, in integrated optics to switch over the path of light rays between single optical wave guides (optical fibers) or those situated in an array. Such oscillating mirror devices are known in various design variants, and have a controllable drive—integrated into the mirror or situated next to the mirror on the same chip—which generates the tilting motions of the mirror surface, and therewith the optical switching procedures.

These tilting motions, in which the movable, micromechanically exposed part of the oscillating mirror device, that is, the island region, whose upper side forms the mirror surface, is able to execute torsional vibrations which have an amplitude such that a part of the island region reaches into the area of the silicon substrate layer that has been etched free, assume that there is a deep-running free space under the island region, according to the size of the desired tilt angle. The area etched bare naturally has to have at least the lateral dimensions of the island region.

Large deflections perpendicular to the chip surface, as are required for oscillating mirror devices or other optical components in micromechanics (optical MEMS), are currently not able to be produced in surface micromechanics, since the usual sacrificial layers and etching techniques used permit only the motion of the structures exposed by a few micrometers perpendicular to the surface, which corresponds to a tilt angle of only a few degrees, which is insufficient for many applications.

Optical components having large vertical deflections, e.g., oscillating mirror devices, are, as is described, for example, in published German Patent Document DE 197 57 197 cited above, at this time, therefore, mostly achieved in that the mirror structures are structured from the wafer front and are disengaged from the backside of the carrier substrates using the methods of volume (bulk) micromechanics. In this context, SOI material is generally used and it is necessary to etch through the silicon substrate layer starting from the backside, with the aid of anisotropic wet etching, up to the upper silicon layer (or oxide layer), while the lateral exposing of the island region, before or after wet etching, is done by a dry etching method.

A front side deep etching method, using which, micromechanical structures are exposed laterally and vertically, is described in U.S. Pat. No. 5,198,390 that was mentioned at the outset. In that document, the so-called SCREAM process (single crystal reactive etching and metallization process) starts from a uniform monocrystalline silicon wafer, i.e., it is not able to be subdivided into separate functional layers and sacrificial layers, in which all structuring steps and deep etching steps are carried out uninterruptedly with the aid of reactive ion etching (RIE). In this context, first of all, the etching mask is structured by RIE etching, subsequently the corresponding trench structures are generated in the wafer by RIE deep etching, then, by selective masking of the side walls of the trenches, the structure to be exposed is specified, and finally the substrate region below the selected (island) structure is exposed by complete etching undercutting using RIE. The SCREAM process stands out, on the one hand, by great process uniformity, and on the other hand, by the etching undercutting takes place at a low etching rate typical of the process, which has a negative effect, particularly in the case of wide selected (island) structures. Especially problematic with respect to applications particularly for oscillating mirror devices is the fact that the unprotected underside of the selected (island) structure, in response to etching undercutting of the region of the silicon substrate lying below it, is considerably attacked as well.

SUMMARY

A method according to the present invention provides the steps of:
making available an SOI substrate or an EOI substrate having an Si functional layer which is provided, while an oxide layer is interposed, on a silicon substrate layer, whose upper region is provided as a sacrificial layer;
forming at least one trench that reaches through the functional layer up to the oxide layer, by a first anisotropic plasma etching step which exposes the later island region laterally with respect to the functional layer;
generating a passivating layer that covers at least the sidewalls of the trench, and subsequent opening of the trench floor up to the silicon substrate layer by a physical directed etching method;
deep etching of the trench using a second anisotropic plasma etching step starting from the opened trench floor and going to a predetermined depth of the silicon substrate layer, this plasma etching step specifying the depth of the sacrificial layer; and
carrying out an isotropic sacrificial layer etching step for removing a region of the sacrificial layer below the island region by lateral etching undercutting, starting from the trench, of the silicon substrate layer, in such a way that the island region is exposed and made vertically movable.

The present invention provides that, starting from the front side of an SOI substrate or EOI (epipoly on insulator) substrate, to advance, in two consecutive, separate deep etching steps, into the desired depth of the silicon substrate layer, and to use this partially—more accurately: in its upper region close to the oxygen layer—as the sacrificial layer for vertically exposing the island structures positioned above the oxide layer in the functional layer. The method according to the present invention of a sacrificial layer process for generating large vertical deflections is based on purely surface micromechanical process steps.

According to the present invention, in a first step, a mirror) structure is generated using a deep etching method in SOI or EOI. For this, any anisotropic plasma etching method suitable for the functional layer may be used, e.g., the fluorine based Si deep etching method described in German Patent Document DE 42 41 045, which includes alternating, successive, separate etching steps and polymerization steps. The etch stop takes place on the oxygen layer.

After the first deep etching step, the (mirror) structure is passivated using an additional layer. The passivation is opened in the structure trenches of the (mirror) structure. A second deep etching step is performed, using which the sacrificial layer, here, the upper region of the silicon substrate layer near the oxide layer, is opened up into the depth. Thus, according to the present invention, the depth of the sacrificial layer is essentially (i.e. except for the inaccuracies coming about typical of the process in the etchings involved) set by a specified second deep etching process. In order to detach the (mirror) structure completely, an isotropic, lateral dry etching step follows next.

The present invention utilizes a continual front side processing in order to implement micromechanical devices which permit large deflections, along with a ground clearance of ca 1 to 200 μm. Furthermore, a great process control is possible, especially an exact depth setting to ±5%. A particular advantage of the method is the high vertical and lateral etching rates.

A good control, given by the use of an EOI substrate, of the stress gradients (mirror upper side/mirror lower side) in the functional layer makes possible a high resolution or an adjustable arching of the mirror surface in optical systems. Furthermore, according to the present invention, relatively thin mirrors (order of magnitude: <10 μm, compared to a 50 μm thickness of the functional layer, at substrates that are etched through from the backside of the wafer) are possible (epipoly, LPCVD-Si, oxide layers or metal layers as original mirror material or mirror material subsequently deposited as additional layer(s)). Based on these slight thicknesses of the mirror and the correspondingly slight mass, high natural frequencies, and therewith a high switching speed, of optical components may be achieved.

Beyond that, the possibility exists of combining the sacrificial layer process according to the present invention with additional production steps, such as for generating additional functional planes above or below the mirror structure plane and additional sacrificial layer technology (e.g. gas phase etching of oxides), for the production of drive structures (e.g. electrodes) in a second epipoly structural plane or of thin torsion springs. The method according to the present invention may be a part of a complex overall process, in which, for instance, buried circuit traces and/or additional semiconductor structures are generated in the substrate.

According to one example embodiment of the present invention, the sacrificial layer etching step takes place selectively with respect to the passivating layer and the oxide layer. This has decisive advantages for the precision characteristics of the process. On the one hand, thin mirror structures are able to be generated, since these are not attacked, i.e. not used up in the subsequent sacrificial layer etching step.

These inert characteristics are particularly important even in producing relatively large (2-3 mm) island areas, since the isotropic gas phase etching step, starting from a single peripheral trench, requires a non-negligible time to advance up to the middle of the free space to be generated.

In order to shorten this time, or rather, in order not to subject the passivated functional structures to an etch attack lasting overly long, it is advantageous that, inside the island region, additional trench structures are provided and etched to sacrificial layer depth, so that the sacrificial layer etching step may be carried out faster, starting from all trenches simultaneously. Based on the passivating layer and the high isotropic etching rates, compared to the SCREAM method, considerably fewer such perforation holes are required.

An example embodiment of the method according to the present invention is made up of the production of a micromechanical oscillating mirror device. In this context, the island region is connected, via one or more connecting crosspieces, to the region of the functional layer surrounding the island region, so that the exposed island region is able to perform motions, e.g., torsional vibrations, about the one or the several connecting crosspieces, which have such an amplitude that a part of the island region projects into the region of the silicon substrate layer that has been etched free.

This embodiment may be further modified in that, above the trench and the further trench structures developed as perforation holes at least one additional layer, e.g., one that improves the reflectivity of the mirror surface, is deposited in such a way that the perforation holes are closed, but not the trench that separates the island region from the surrounding region.

This may be achieved in a particularly advantageous way by developing the trench that exposes the island region laterally wider than the additional trench structures.

From a process technology point of view, according to an additional further example embodiment of the method, it is advantageous that the sacrificial layer etching step is carried out by chemical dry etching, using one of the gases $XeF_2$, $ClF_3$, $NF_3$ or $BrF_3$.

According to one further example embodiment, the passivating layer may be applied by CVD depositing or by thermal oxidation.

According to still another example embodiment of the method, it is advantageous to remove the passivating layer and/or the oxide layer again after the sacrificial layer etching step, especially by chemical dry etching using the gas $HF/H_2O$.

BRIEF DESCRIPTION OF THE DRAWINGS

FIG. 1A and FIGS. 2 through 8 each show a schematic cross sectional representation (cross section taken along line AA' shown in FIG. 1B) of a different stage of the production process for an oscillating mirror device according to the present invention.

DETAILED DESCRIPTION

Figure 1A:
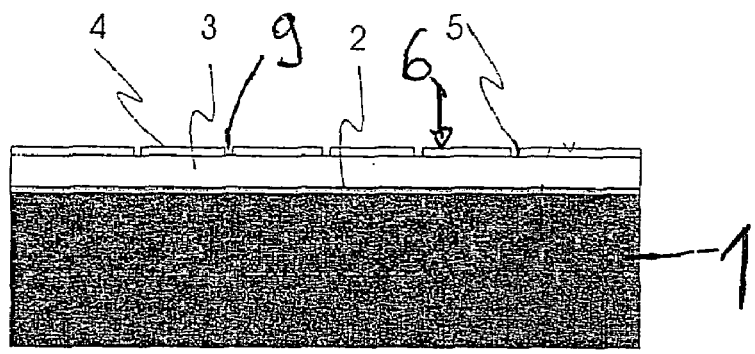

FIG. 1A shows, as an example, an EOI layer sequence having a silicon substrate layer 1 (n or p doped, (100) or (111) oriented) of an oxide layer 2 made of thermal or CVD oxide, which has a thickness of ca 50 nm to 1 μm, a Si functional layer 3 made of epipoly (or, in the case of SOI, of polysilicon), and an etching mask 4, made, for instance, of lacquer or oxide.

Figure 1B:
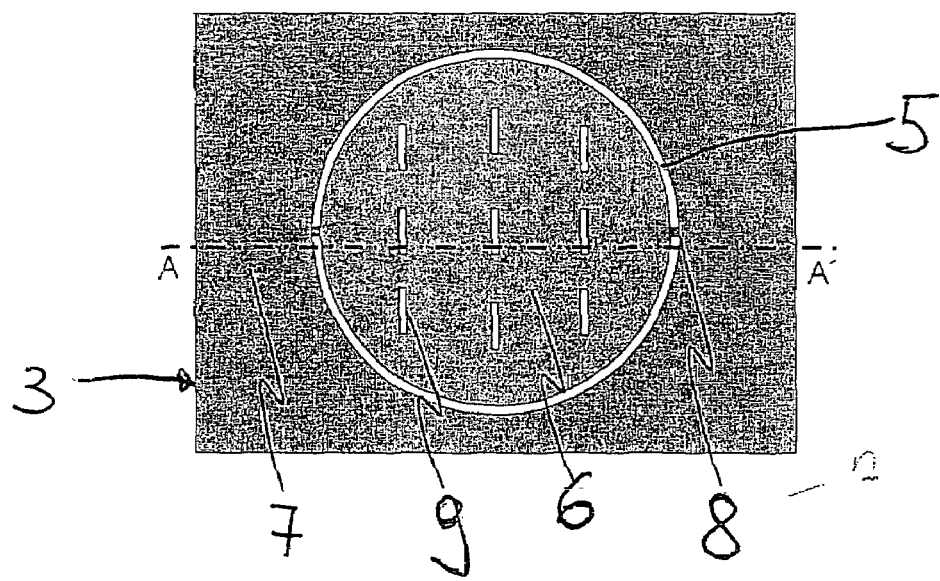
FIG. 1B shows a top view of an oscillating mirror (without drive) in the processing stage shown in FIG. 1A.

FIG. 1B shows (at this stage in the process in each case only present in mask structure 4) trench 5, which delimits island region 6 from the surrounding (immovable) region 7 of functional layer 3. Torsion springs 8 are also recognizable, on which island region 6, that is, the mirror structure, is suspended. This defines the rotational axis for the eventual oscillating mirror. Connecting crosspieces, that is, narrow regions of functional layer 3 that have been left standing, may be used as torsion springs 8.

The upper side of mirror structure 6, as may also be seen in FIGS. 1A and 1B, depending on lateral extension, may be provided with more or fewer perforation holes 9, which will be discussed in more detail below in connection with the description of FIG. 8. If such perforation holes 9, that is, additional (future) trench structures, are provided, they are incorporated below into the same deep etching steps or passivating steps as trench 5 that is to be generated.

The result of the next process step, that is, after first anisotropic plasma etching step takes place, is shown in FIG. 2, and trench structures 5 and 9 generated in functional layer 3 may be recognized. This etching step runs selectively with respect to oxide and stops abruptly at oxide layer 2. Outer trench 5, which separates movable island region 6 from the fixed surrounding regions 7, should be slightly wider than perforation holes 9, as will be explained in more detail below in connection with FIG. 8.

FIG. 3 shows the process stage after the depositing of a passivating layer 10 (also in trench structures 5 and 9, but not shown there). This passivating layer 10 is not attacked or only attacked to a very slight degree, in a subsequent sacrificial layer etching step that uses gases such as at least one of the gases $XeF_2$, $ClF_3$, $NF_3$ or $BrF_3$. The depositing may be performed using known methods, such as thermal oxidation, LPCVD (low pressure), PECVD (plasma enhanced chemical vapor deposition) or even ozone-supported TEOS deposition. Besides the typical silicon oxide passivating layer, other inorganic passivating layers may also be used (such as metals, nitrides, SiC, etc), which have a sufficient, continuous, and, in the ideal case homogeneous edge coverage in the region of the sidewall, and may be etched selectively with respect to island region 6 in a later step.

In selecting the deposition method among the ones that come under consideration, one should observe that on the bottoms of etching trenches 5 and 9 only slight deposition takes place, that may later be removed again, using relatively little effort.

Figure 4:
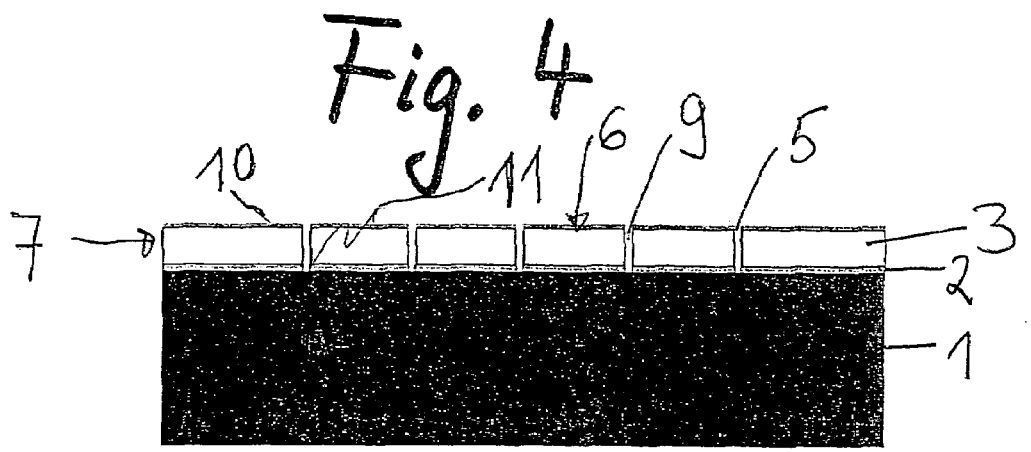

FIG. 4 shows the next process stage, after oxide layer 2 (and passivating layer 10) were opened by a physically directed etching method in the region of the trench bottoms, in such a way that openings 11 are created all the way to silicon substrate layer 1. In this etching, one should take care not to destroy the sidewall passivation. This requirement may be fulfilled by an RIE or other method, using a suitable plasma guidance that acts perpendicular to the wafer surface.

Figure 5:
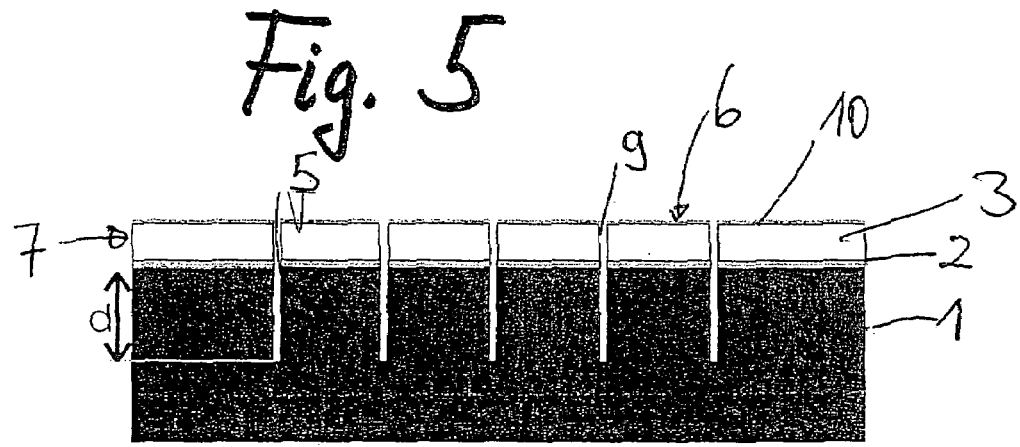

FIG. 5 shows the method stage after trench 5 and additional trench structures 9 were etched using a second anisotropic plasma etching step to the desired depth d. By this depth d, essentially, the depth of the subsequent sacrificial layer etching process is specified (cf FIG. 6).

Figure 6:
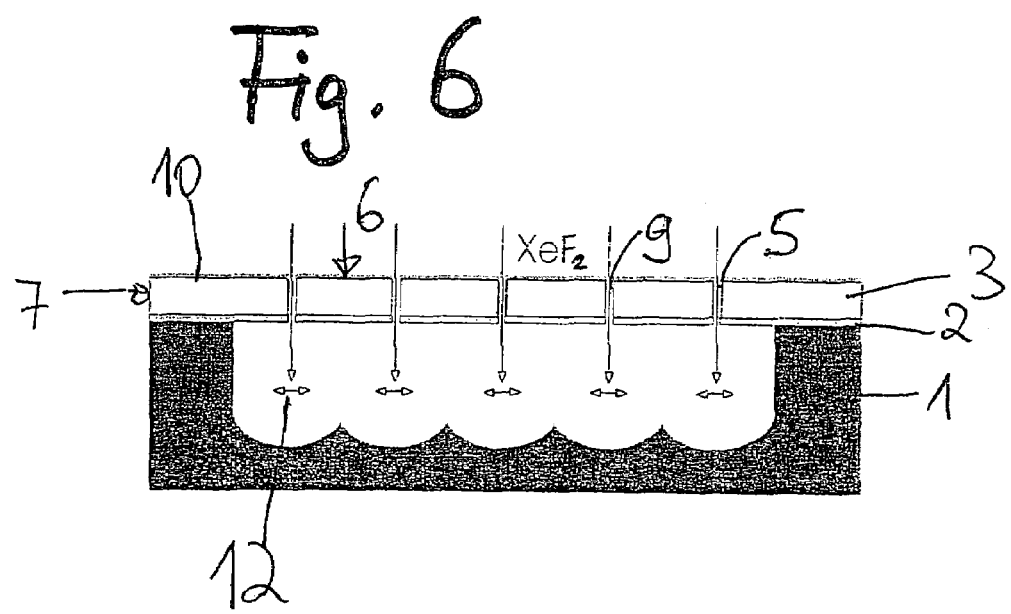

FIG. 6 shows the process stage in which trench structures 5 and 9 are laterally etched by an isotropic silicon etching step. Because of passivating layer 10 that has been applied and oxide layer 2, mirror structure 6 remains intact, in spite of the massive undercutting etching of silicon substrate layer 1. The etching process may, for instance, be carried out using the gases $XeF_2$, $ClF_3$, $NF_3$ or $BrF_3$ by way of gas phase etching having a relatively high etching rate. The arrows in FIG. 6 indicate the penetration of $XeF_2$ into depth d of silicon substrate layer 1. In the case of large lateral widths (2 to 3 mm) of island structure 6, it is advantageous if the latter is exposed by an etching process that spreads simultaneously from several trench structures 5 and 9.

A specified region 12 underneath island region 6 is removed by the isotropic etching process. In principle, island region 6 may, at this point, be deflected into the opening left behind in silicon substrate layer 1. This brings with it no problems with respect to mechanical stability, since, even at an etching depth d of 200 µm, silicon substrate layer 1, which has a thickness of ca 600-700 µm, remains preserved having sufficient substance.

If necessary, as shown in FIG. 7, it is possible without problem to remove again passivating layer 10 (and oxide layer 2) after the isotropic silicon sacrificial layer etching step using a method such as chemical dry etching using the gas $HF/H_2O$. This is indicated by the arrows in FIG. 7.

Likewise, as shown in FIG. 8, if necessary, it is possible to deposit one or more additional layers 13 on the mirror surface that is perforated possibly by the further trench structures 9, that is, on the upper side of island region 6. Thereby, for example, the reflectivity of the mirror surface may be improved. As the deposition process, a method may be selected in which a conformal edge covering occurs (e.g. LPCVD of Si or Ge or SiGe, or a metallization) and in which closure 14 comes about of the possibly present small perforation holes (width <4 µm). In the design of mirror layer 13 one must take care that trench 5, which separates movable structures 6 from fixed structures 7, is wider than perforation holes 9. Thereby, in the region of trench 5, one may avoid the impairing closure of the functioning of oscillating mirror 6. Accordingly, for possible additional upper side process steps, a closed mirror surface may be offered after, or rather by, coating 13.

Although the present invention was described above in light of an exemplary embodiment, it is not restricted to it, but is able to be modified in diverse ways.

For example, additional process steps not shown in the figures may be provided in order to implement an actuator element acting as an electrostatic drive for moving oscillating mirror 6. This actuator element may include, for instance, a capacitor that has a voltage applied from the outside, whose one electrode is formed at the bottom of the opening left behind by removed region 12, and whose other electrode is formed by the underside of island structure 6. However, spatial separation of mirror element 6 from the actuator element (on one chip) is also possible.

Using the production methods according to the present invention, it is possible to manufacture micromechanical oscillating mirrors for very high amplitudes, for use in building lasers, barcode lasers, room monitoring lasers, seat occupancy detection in motor vehicles or the like.

Finally, in the above exemplary embodiment, a mirror structure was shown, but the present invention may be used also for structures in which island region 6 is not a mirror element but rather another kind of mechanical actuator, such as an controlling mechanism or the like.

What is claimed is:

1. A method for producing a micromechanical oscillating mirror device, comprising:
   providing one of an SOI and an EOI structure having a silicon substrate layer, an oxide layer provided on the silicon substrate layer, and an Si functional layer provided on the oxide layer, wherein an upper region of the silicon substrate layer is provided as a sacrificial layer;
   forming at least a first trench that extends through the functional layer to the oxide layer, by a first anisotropic plasma etching step that exposes a laterally-formed island region in the functional layer;

providing a passivating layer that covers at least the sidewalls of the trench;

extending a bottom of the first trench to the silicon substrate layer by a physically directed etching;

deep etching the first trench using a second anisotropic plasma etching step starting from the bottom of the trench and extending the trench to a predetermined depth of the silicon substrate layer, wherein the second anisotropic plasma etching step specifies the depth of the sacrificial layer; and performing an isotropic sacrificial layer etching step starting from the first trench to remove a region of the sacrificial layer below the island region by lateral etching undercutting of the silicon substrate layer, whereby the island region is exposed and made vertically movable.

2. The method as recited in claim 1, wherein the isotropic sacrificial layer etching step takes place selectively with respect to the passivating layer and the oxide layer.

3. The method as recited in claim 2, wherein the exposed island region is connected to a region of the functional layer that surrounds the island region by at least one connecting crosspiece, whereby the exposed island region is able to perform torsional motions about the at least one connecting crosspiece, the torsional motions having an amplitude such that a part of the island region projects into a region of the silicon substrate layer that has been etched.

4. The method as recited in claim 3, wherein the at least one connecting crosspiece includes a narrow region of the functional layer that has been left intact.

5. The method as recited in claim 1, further comprising:

forming at least a second trench within the island region and etching the second trench to the sacrificial layer depth;

wherein the isotropic sacrificial layer etching step is performed simultaneously from both the first and second trenches.

6. The method as recited in claim 5, further comprising:

forming at least one additional layer on top of the functional layer, wherein the at least one additional layer improves the reflectivity of the mirror surface, the at least one additional layer covering the second trench within the island region but exposing the first trench that separates the island region from the surrounding functional layer.

7. The method as recited in claim 6, wherein the first trench is wider than the second trench.

8. The method as recited in claim 1, wherein the sacrificial layer etching step includes chemical dry etching using one of $XeF_2$, $ClF_3$, $NF_3$ and $BrF_3$ gas.

9. The method as recited in claim 5, wherein the sacrificial layer etching step includes chemical dry etching using one of $XeF_2$, $ClF_3$, $NF_3$ and $BrF_3$ gas.

10. The method as recited in claim 6, wherein the sacrificial layer etching step includes chemical dry etching using one of $XeF_2$, $ClF_3$, $NF_3$ and $BrF_3$ gas.

11. The method as recited in claim 1, wherein the passivating layer is formed by one of CVD deposition and thermal oxidation.

12. The method as recited in claim 5, wherein the passivating layer is formed by one of CVD deposition and thermal oxidation.

13. The method as recited in claim 6, wherein the passivating layer is formed by one of CVD deposition and thermal oxidation.

14. The method as recited in claim 1, further comprising:

removing, by a chemical dry etching using HF/H2O gas, at least one of the passivating layer and the oxide layer after the sacrificial layer etching step.

15. The method as recited in claim 5, further comprising:

removing, by a chemical dry etching using HF/H2O gas, at least one of the passivating layer and the oxide layer after the sacrificial layer etching step.

16. The method as recited in claim 6, further comprising:

removing, by a chemical dry etching using HF/H2O gas, at least one of the passivating layer and the oxide layer after the sacrificial layer etching step.

* * * * *